United States Patent
Jau et al.

(10) Patent No.: US 9,408,324 B2
(45) Date of Patent: Aug. 2, 2016

(54) MODULAR CHASSIS AND ASSEMBLING METHOD THEREOF FOR ACCOMMODATING SERVER

(71) Applicant: Quanta Computer Inc., Taoyuan Shien (TW)

(72) Inventors: Maw-Zan Jau, Taipei (TW); Chao-Jung Chen, New Taipei (TW); Chih-Ming Chen, Taoyuan County (TW)

(73) Assignee: QUANTA COMPUTER INC., Guishan Dist., Taoyuan (TW)

( * ) Notice: Subject to any disclaimer, the term of this patent is extended or adjusted under 35 U.S.C. 154(b) by 8 days.

(21) Appl. No.: 14/472,493

(22) Filed: Aug. 29, 2014

(65) Prior Publication Data

US 2015/0264832 A1 Sep. 17, 2015

(30) Foreign Application Priority Data

Mar. 17, 2014 (TW) .............................. 103109952 A

(51) Int. Cl.
*H05K 7/00* (2006.01)
*H05K 7/14* (2006.01)
*H05K 9/00* (2006.01)
*H05K 5/02* (2006.01)

(52) U.S. Cl.
CPC ............ *H05K 7/1492* (2013.01); *H05K 7/1488* (2013.01); *H05K 5/0217* (2013.01); *H05K 5/0247* (2013.01); *H05K 9/0007* (2013.01); *Y10T 29/49826* (2015.01)

(58) Field of Classification Search
CPC ....... G06F 3/0689; G06F 3/0683; G06F 1/16; G06F 1/181; H05K 7/1449; H05K 7/1487; H05K 7/1489; H05K 5/0069; H05K 7/14; H05K 7/1438; H05K 7/1452; H05K 7/1474; H05K 7/1488; H05K 7/1492; H05K 7/183; H05K 7/20736; H05K 5/0247; H05K 5/0217; H05K 9/0007; Y10T 29/49826
USPC ............... 361/679.33–679.39, 752, 724–727, 361/788; 312/223.1–223.2
See application file for complete search history.

(56) References Cited

U.S. PATENT DOCUMENTS

| | | | | |
|---|---|---|---|---|
| 4,918,572 A | * | 4/1990 | Tarver | G06F 1/18 361/736 |
| 6,324,062 B1 | * | 11/2001 | Treiber | G06F 1/181 312/223.2 |
| 7,142,411 B2 | * | 11/2006 | McLeod | G06F 1/182 174/50 |

FOREIGN PATENT DOCUMENTS

| | | |
|---|---|---|
| TW | 383164 | 2/2000 |
| TW | M248198 | 10/2004 |
| TW | M3931321 U1 | 11/2010 |
| TW | 201247087 A1 | 11/2012 |

* cited by examiner

*Primary Examiner* — Anthony Haughton
*Assistant Examiner* — Ingrid Wright
(74) *Attorney, Agent, or Firm* — Rabin & Berdo, P.C.

(57) ABSTRACT

A modular chassis includes a first casing module, a second casing module and a back plate module. The second casing module and the back plate module are disposed inside the first casing module. The first casing module includes a first outer box and a second outer box, in which the second outer box is capable of sliding relative to the first outer box and joining to the first outer box such that the length of the first casing module is adjustable.

9 Claims, 7 Drawing Sheets

MODULAR CHASSIS AND ASSEMBLING METHOD THEREOF FOR ACCOMMODATING SERVER

RELATED APPLICATIONS

This application claims priority to Taiwan Application Serial Number 103109952, filed Mar. 17, 2014, which is herein incorporated by reference.

BACKGROUND

1. Field of Invention

The present disclosure relates to a server chassis and an assembling method thereof, and more particularly, to a server chassis with capability of adjusting its length for accommodating different lengths of servers.

2. Description of Related Art

Currently, servers are more and more broadly used. A home office or an enterprise can stores a large amount of video data or archives by servers. Therefore, the management and placement of multiple servers become an issue cannot be ignored. An appearance of a one of conventional severs may be shaped like a rectangular box, which generally has standard dimensions. For example, a server of 1U has a width of 19 inches and a height of 1.75 inches.

However, there is no standard about lengths of the conventional servers in the market. Different types of servers from different manufacturers may have different lengths. For accommodating servers with different lengths, a user may need to purchase many chassis with different sizes to meet the lengths requirements of the servers, which causes inconvenience.

SUMMARY

Accordingly, one aspect of the present invention is to provide a modular chassis with adjustable length to accommodate different types of servers.

According to an embodiment of the present invention, a modular chassis is provided for accommodating a server. The modular chassis includes a first casing module, a second casing module and a back plate module. The first casing module includes a first outer box and a second outer box. The first outer box includes a first shield with a plurality of first fixing holes arranged along a direction. The second outer box is fit in the first outer box, and is capable of sliding along the direction relative to the first outer box. The second outer box includes a second shield with a second fixing hole, in which the second fixing hole is fixed with one of the first fixing holes. The second casing module is disposed inside the first casing module and includes a plurality of power supply units. The back plate module is disposed inside the first casing module and includes a first surface and a second surface opposite to each other. The first surface includes a plurality of slots, and the second surface is faced to the second casing module and is electrically connected to the power supply units. The server is disposed inside the first casing module and is inserted into one of the slots.

According to another embodiment of the present invention, an assembling method of a modular server is provided. The assembling method includes assembling a first casing module. The assembling of the first casing module includes providing a first outer box and providing a second outer box, in which the second outer box is configured to fit in the first outer box, and the second outer box is capable of sliding along a direction relative to the first outer box. Then, the method includes assembling a back plate into the first outer box, in which the back plate includes a first surface and a second surface opposite to each other, and the first surface includes a plurality of slots. Each of the slots is configured to be connected to a server. Then, the method includes assembling a second casing module into the first outer box, in which the second casing module includes a plurality of power supply units configured to be electrically connected to the first surface of the back plate.

As discussed above, according to the above embodiments, the first casing module of the modular chassis includes the first outer box and the second outer box, and through fixing the first shied of the first outer box with the second shied of the second outer box, the length of the first casing module is adjustable, so as to accommodate different types of servers.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
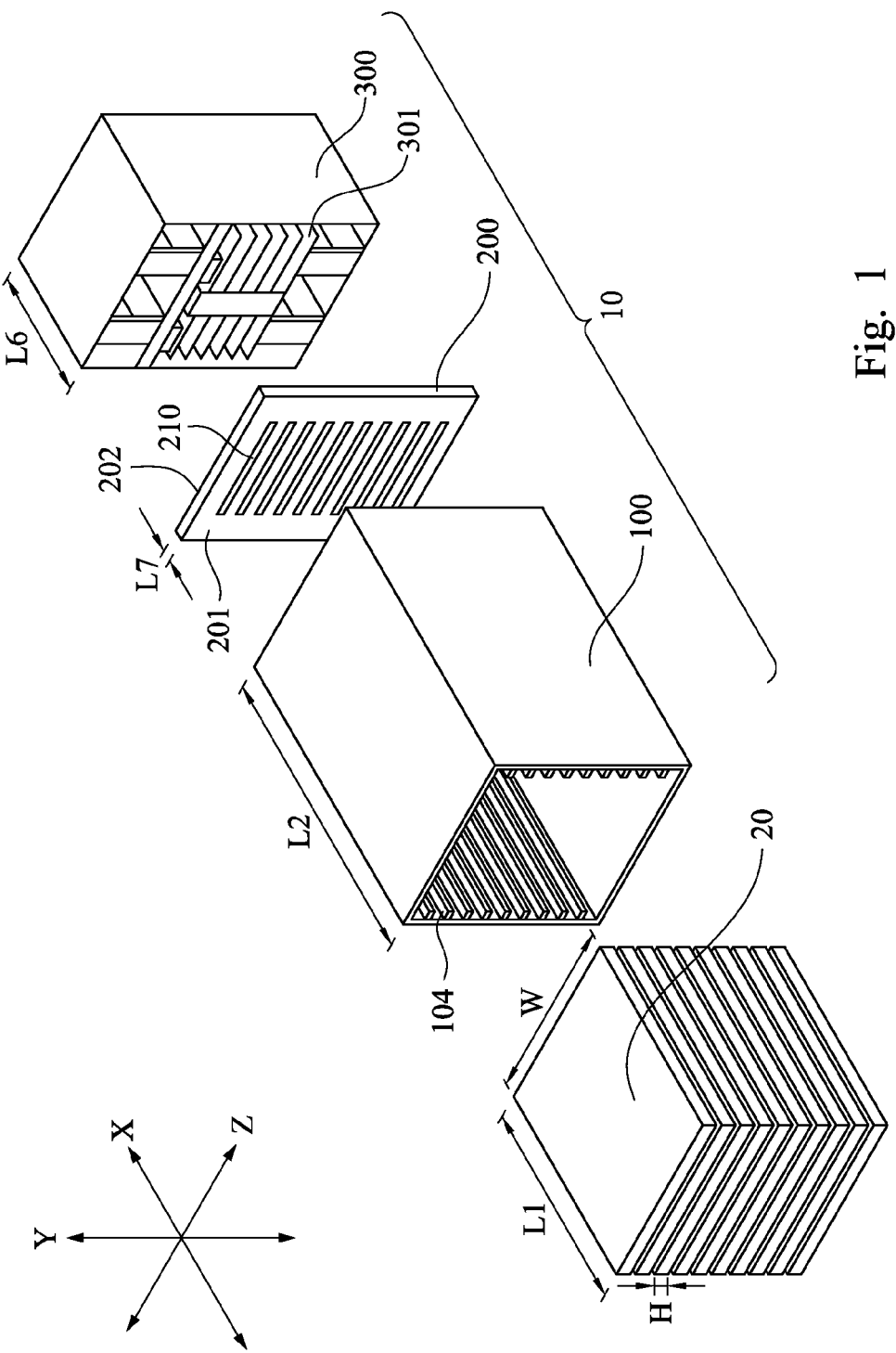
FIG. 1 illustrates an exploding view of a modular chassis and a server in accordance with an embodiment of the present invention.

The following embodiments are disclosed with accompanying diagrams for detailed description. For illustration clarity, many details of practice are explained in the following descriptions. However, it should be understood that these details of practice do not intend to limit the present invention. That is, these details of practice are not necessary in parts of embodiments of the present invention. Furthermore, for simplifying the drawings, some of the conventional structures and elements are shown with schematic illustrations. Wherever possible, the same reference numbers are used in the drawings and the description to refer to the same or like parts.

In the following embodiments, the server may be in rectangular shape, in which the height of the server is normally fixed, for example, a 1U server has the height of 1.75-inch. On the other hand, the width and the length of the server may be different among different embodiments.

In the following embodiments, a connecting portion of two outer boxes of a modular chassis can be changed, so that the chassis can accommodate different lengths of servers. Please refer to FIG. 1, which illustrates an exploding view of a modular chassis 10 and a server 20 in accordance with an embodiment of the present invention. The modular chassis 10 can be used to accommodate a plurality of servers 20 and the modular chassis 10 includes a first casing module 100, a second casing module 300 and a back plate module 200.

Each of the servers 20 can be in rectangular shape with the height H, the width W and the length L1. In variety embodiments, the Height H is fixed, but the width W and the length L1 can be different according to different manufacturers. In present embodiment, the length L2 of the first casing module 100 is adjustable, so that the first casing module 100 can be used to accommodate different the servers 20 with different lengths L1.

Figure 2:
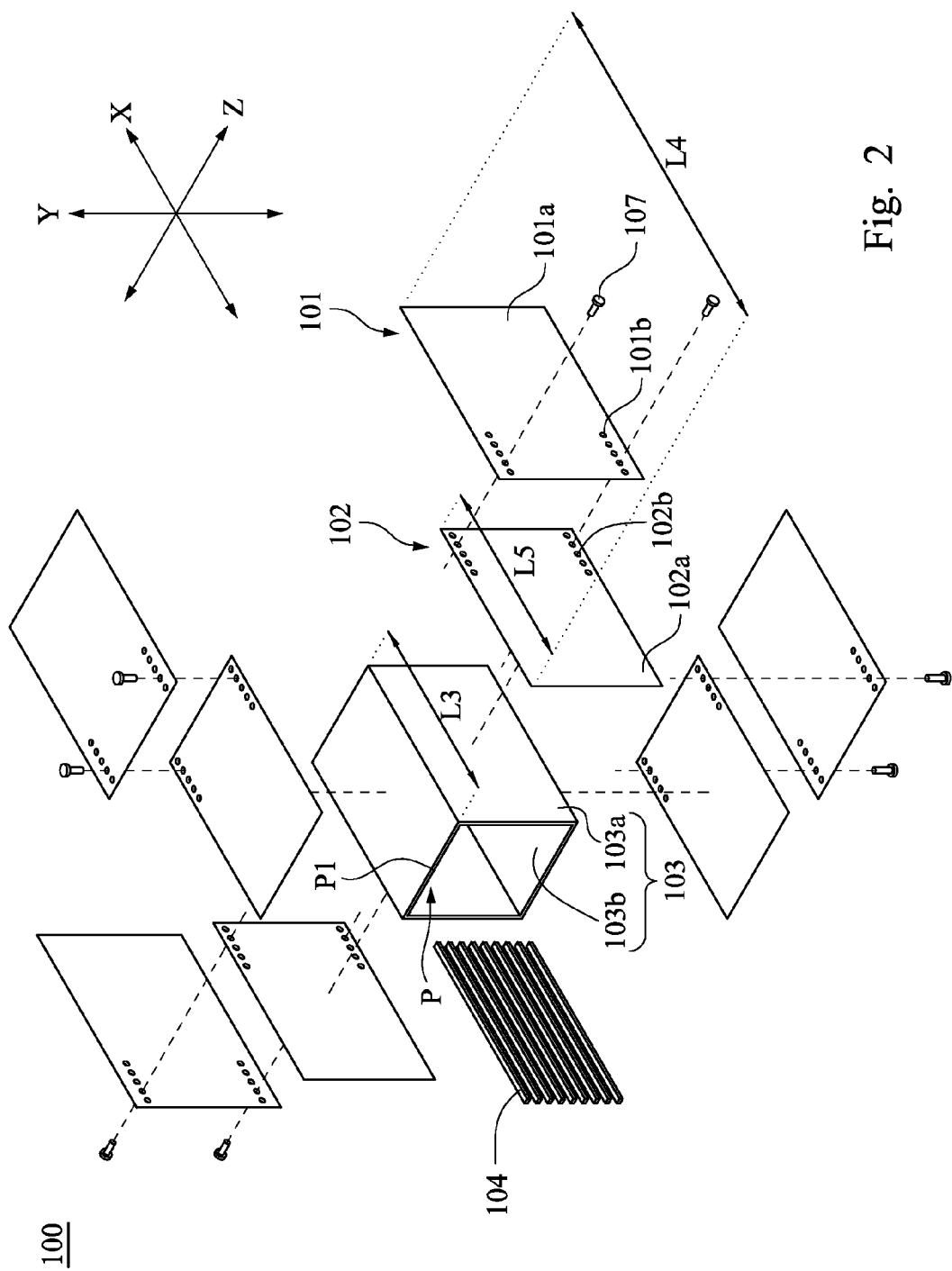
FIG. 2 illustrates an exploding view of a first casing module in accordance with an embodiment of the present invention.

With reference made to FIG. 2 for an exploding view of the first casing module 100 in accordance with an embodiment of the present invention, the first casing module 100 includes a first outer box 101 and a second outer box 102. The first outer box 101 may have fourth first shields 101a, and each of the first shields 101a has a plurality of first fixing holes 101b arranged along a direction X. The direction X is substantially parallel to the direction of length L2 in FIG. 1.

Similarly, the second outer box 102 includes fourth second shields 102a, and each of the second shields 102a has a plurality of second fixing holes 102b, in which one of the second fixing holes 102b can be selectively fixed with one of the first fixing holes 101b. As a result, the second outer box 102 can be fit in the first outer box 101. Furthermore, the second outer box 102 can be slidably moved along the direction X relative to the first outer box 101, so as to change the fixing position between the first fixing holes 101b and the second fixing holes 102b to adjust the length L2 of the first casing module 100.

For example, in FIG. 2, there are five first fixing holes 101b and five second fixing holes 102b. If the left-most first fixing hole 101b and the right-most second fixing hole 101b is fixed together, the length of the first casing module 100 can be reached its maximum. In present embodiment, a rivet 107 can be passed through the first fixing hole 101 b and the second fixing hole 102b, so as to fixedly fasten the first shield 101a and the second shield 102a, but is not limited thereto. In other embodiments, the fastening of the first shield 101a and the second shield 102a may be implemented by other kinds of fasteners.

With reference made to FIG. 1 and FIG. 2, the modular chassis 10 further includes a back plate 200. The back plate 200 may be disposed inside the first outer box 101. The back plate 200 includes a first surface 201 and a second surface 202. The first surface 201 can be faced to the first casing module 100, and the second surface 202 can be faced to the second casing module 300.

The second casing module 300 includes a plurality of the power supply units 301. The second surface 202 can be electrically connected to each of the power supply units of the second casing module 300.

With reference made to FIG. 1, after defining the length L2 of the first casing module 100, the back plate 200 and the second casing module 300 can be disposed inside the first outer box 101 of the first casing module 100. The first surface 201 of the back plate 200 has a plurality of slots 210, and the first surface 201 can be aligned with an opening of the first outer casing 101, so that the back plate 200 can be disposed inside the first outer box 101. Therefore, as the servers 20 are assembled into the first casing module 100 from outside, each of the servers 20 can be inserted into one of the slots 210, and the second casing module 300 can be used to offer the power to the servers 20 via the back plate module 300.

With reference made to FIG. 2, in present embodiment, the first casing module 100 may have an inner box 103. The inner box 103 is disposed inside the first outer box 101 and the second outer box 102. After the first shields 101a of the first outer box 101 and the second shields 102a of the second outer box 102 are fastened together (the length L2 of the first casing module 100 is defined), the first shield 101a and the second shield 102a can be fixedly disposed on an outer wall 103a of the inner box 103. More particularly, the outer wall 103a of the inner box 103 can have a hooking mechanism or a fastening mechanism (not shown in Figs.), so that after fixing together, the first shield 101a and the second shield 102a can be fixedly disposed on the outer wall 103a of the inner box 103.

In some embodiments, the inner wall 103b of the inner box 103 can encompass to form an accommodating channel P. The server 20 can be disposed inside the accommodating channel P. In one embodiment, an opening P1 of the accommodating channel P can be in rectangular shape, so as to easily put the server 20 into the inner box 103 via the opening P1. In a variety embodiment, the first casing module 100 may further include a plurality of rails 104, and each of the rails 104 can be disposed inside the inner wall 103b of the inner box 103. More specifically, grooves can be set on the inner wall 103b of the inner box 103, and the rails 104 can be slidably disposed on the grooves. In yet another embodiment, the rails 104 can be disposed inside the inner wall 103b of the inner box 103 first, and then the first shield 101a and the second shield 103a can be fixedly disposed on the outer wall 103a of the inner box 103.

With reference made to FIG. 1 and FIG. 2, in one embodiment, the length L3 of the inner box 103 along the direction X can be smaller than the total length L4 of the first shield 101a and the second shield 102a after being fixed together along the same direction X. More specifically, the total length L4 of the first shield 101a and the second shield 102a along the direction X is substantially equal to the length L2 of the first casing module 100 along the direction X. The length L3 of the inner box 103 can be equal to or slightly greater than the length L5 of the second shield 102a. The total length L6+L7 of the second casing module 300 and the back plate module 200 are approximately equal to the total length L4 minus length L5 of the second shield 102a. As a result, the back plate module 200, the second casing module 300 and the server 20 can be encompassed inside the first casing module 100, so as to protect the electrical components, such as the back plate module 200, the second casing module 300 and the server 20.

From the above embodiments, the modular chassis 10 can be divided into four modularized components, which are the rails 104, the first casing modules 100, the back plate module 200 and the second casing module 300. The rails 104, the back plate module 200 and the second casing module 300 are disposed inside the first casing module 100, and the length L2 of the first casing module 100 can be adjustable to accommodate the servers 20 with different lengths L1. Further, if the rails 104, the back plate module 200 and the second casing module 300 are displaced because of some practical requirements resulting in the length of the new rails 104, back plate module 200 and second casing module 300 are different from the original, the length L2 of the first casing module 100 can be adjusted for accommodating new rails 104, back plate module 200 and second casing module 300.

Figure 3:
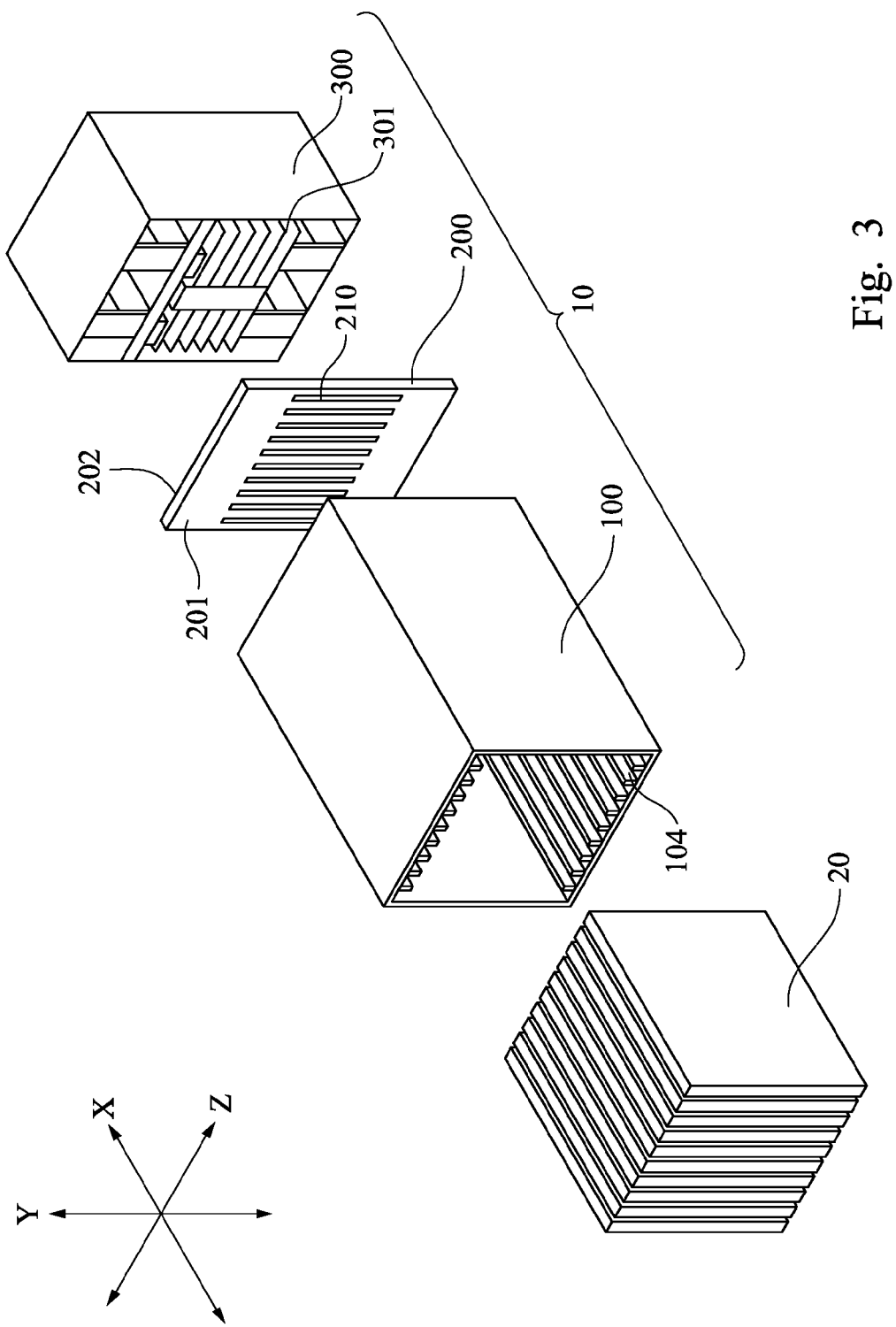
FIG. 3 illustrates an exploding view of a modular chassis and a server in accordance with another embodiment of the present invention.
Figure 4:
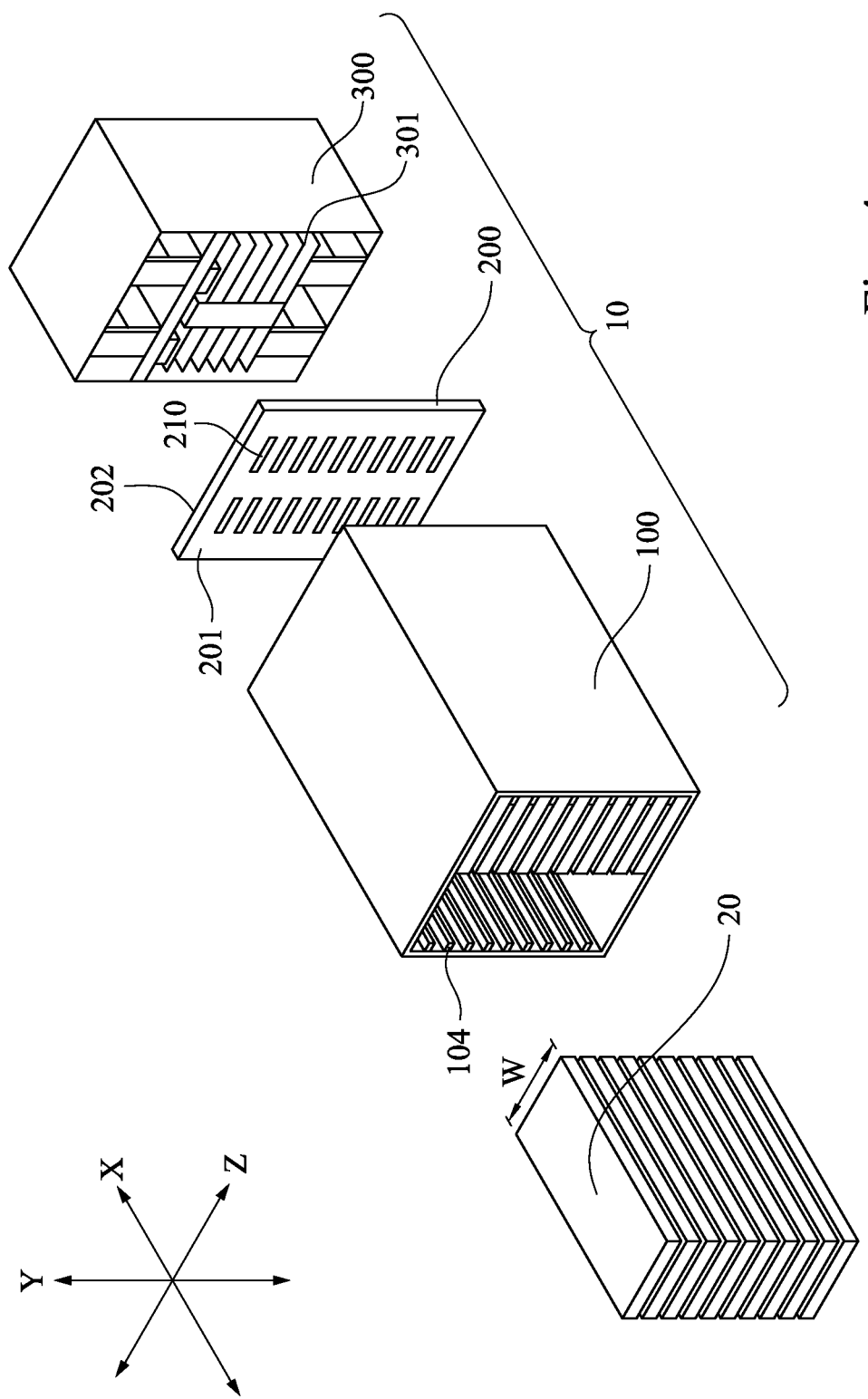
FIG. 4 illustrates an exploding view of a modular chassis and a server in accordance with yet another embodiment of the present invention.

It is noted that, the rails 104 of the above embodiments can be disposed on different positions of the inner wall 103b of the inner box 103 according to the practical requirements of the server 20. For example, with reference made to FIG. 1, if the server 20 is a full-width lying type, the rails 104 can be disposed on two inner walls 103b perpendicular to the direction Z. In this case, the slots 210 of the back plate module 200 can be arranged in a way parallel to the direction Z. Then, with reference made to FIG. 3, in yet another embodiment, if the server 20 is a standing type, the rails 104 can be disposed on two inner walls 103b perpendicular to the direction Y. In this case, the slots 210 of the back plate module 200 can be arranged in a way parallel to the direction Y. Then, with reference made to FIG. 4, in still another embodiment, if the server 20 is a half-width lying type, in which the server 20 in FIG. 4 is half width W relative to the embodiment of FIG. 1. In this case, the slots 210 of the back plate module 200 can be arranged in a way having two rows parallel to the direction Z.

From the above embodiments, through dividing the modular chassis 10 into the rails 104, the first casing module 100, the back plate module 200 and the second casing module 300, the usability of the modular chassis 10 can be enhanced to accommodate variety dimensions of servers 20.

Figure 5:
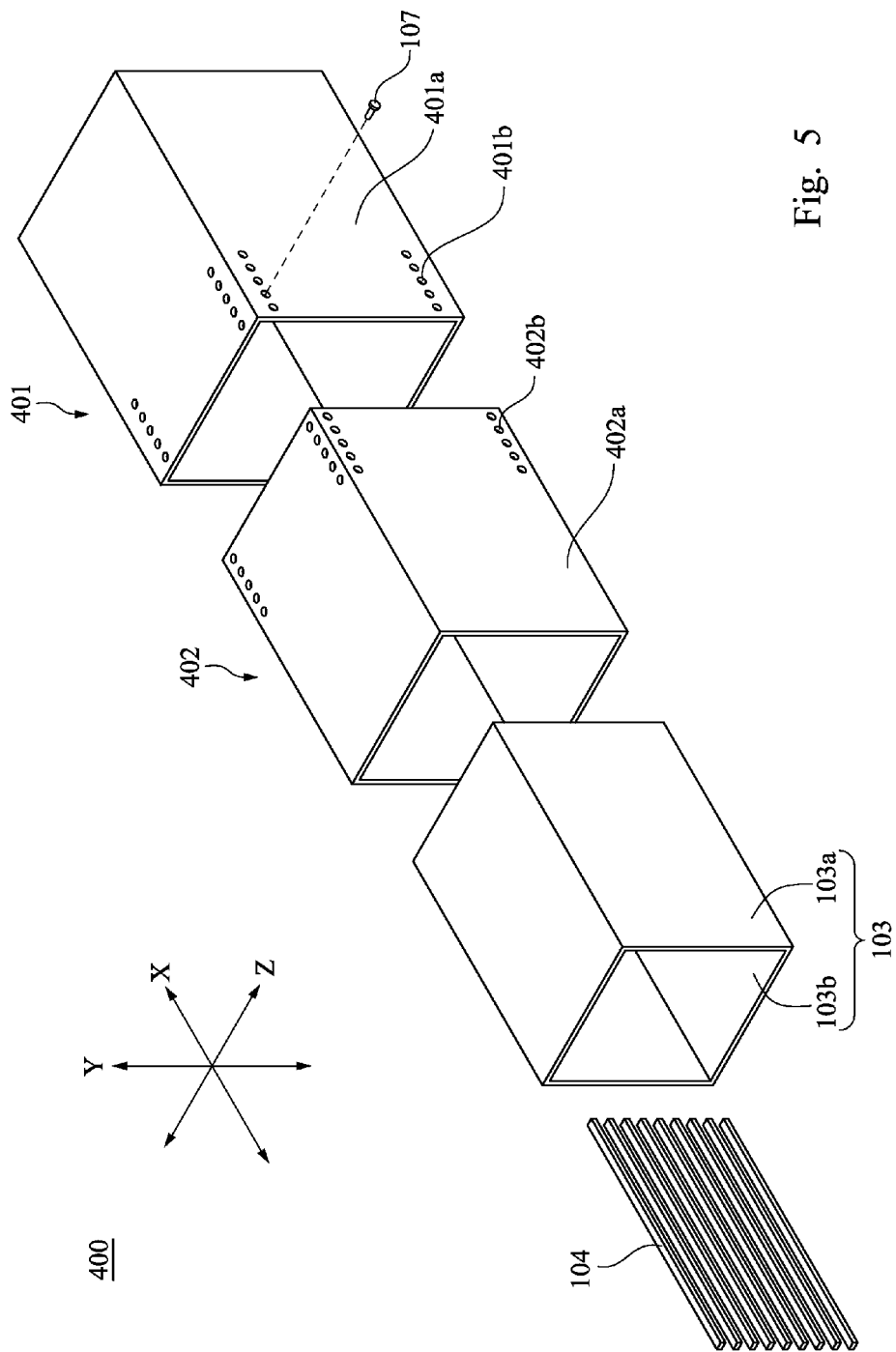
FIG. 5 illustrates an exploding view of a first casing module in accordance with another embodiment of the present invention.

Then, with reference made to FIG. 5 for an exploding view of the first casing module 400 in accordance with another embodiment of the present invention, the different of the present embodiment from the embodiment of FIG. 1 is that, the first outer box 401 and the second outer box 402 of the present embodiment is in cuboid shape, and the first outer box 401 and the second outer box 402 of the embodiment in FIG. 1 is composed by four separated first shields 101a and the second shields 102a. Simply speaking, the first shields 401a of the first outer box 401 are already under a combination state, and the second shield 402a of the second outer box 402 are already under a combination state as well. Further, the first outer box 401 and the second outer box 402 are integrated as a whole with cuboid shape. As a result, a user merely needs to fit the second outer box 402 into the first outer box 401, and using a rivet 107 chooses one of the first fixing holes 401b to fasten with one of the second fixing holes 401b, so as to adjust the length of the first casing module 400.

Figure 6:
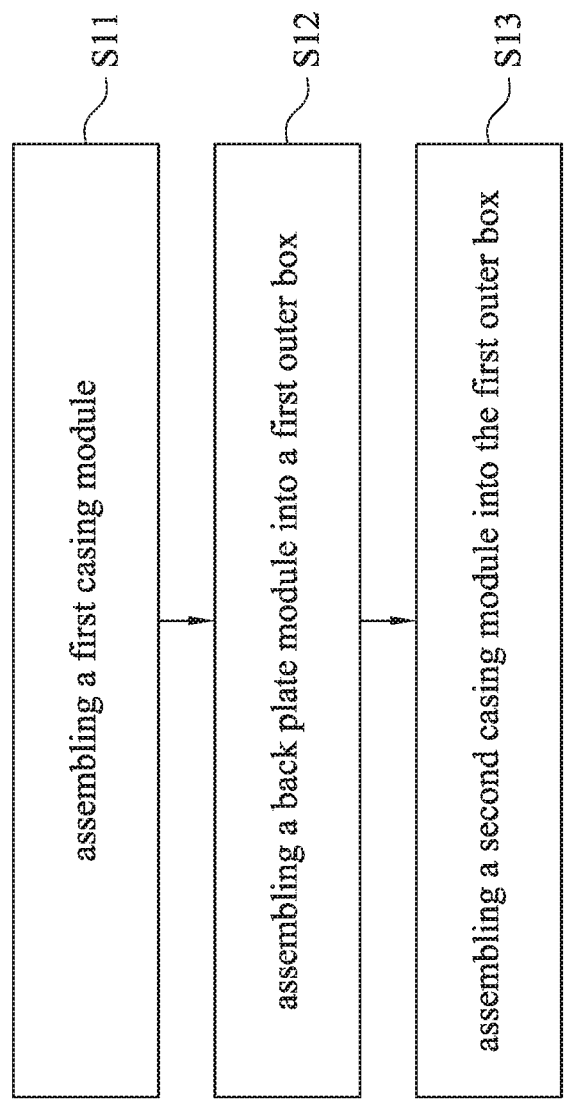
FIG. 6 illustrates a flow chart of an assembling method of a modular chassis in accordance with an embodiment of the present embodiment.
Figure 7:
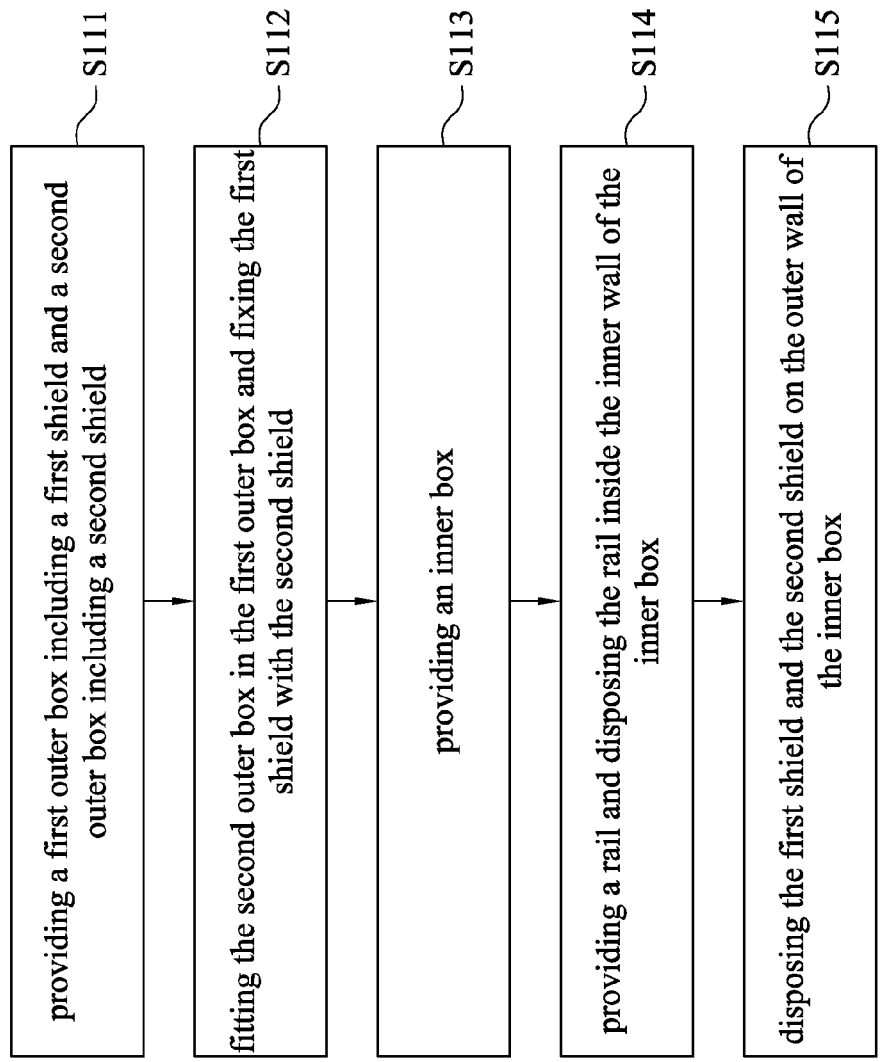
FIG. 7 illustrates a flow chart of an assembling method of a first casing module according to an embodiment of the present invention.

Then, with reference made to FIG. 6 for a flow chart of an assembling method of the modular chassis in accordance with an embodiment of the present embodiment, the method begins at step S11: assembling a first casing module, so as to define the length of the first casing module. More details regarding the assembling of the first casing module are referred to FIG. 2, FIG. 5 and FIG. 7, in which FIG. 7 illustrates a flow chart of an assembling method of a first casing module according to an embodiment of the present invention. First, method of the assembling of the first casing module begins at step S111: providing a first outer box including a first shield and a second outer box including a second shield. As illustrated in FIG. 2, the first outer box 101 can include multiple first shields 101a, but is not limited thereto. In FIG. 5, the first shield 401a of the first outer box 401 can be one single cuboid body. Similarly, the second outer box 402 can include one or more second shields 402a. The first shield 101 or 401 may include a plurality of first fixing holes 101a or 401a, and the second shield 102 or 402 may include at least one second fixing hole 102a or 402a, in which the first fixing holes 101a or 401a are arranged along the direction X.

Then, at step S112: fitting the second outer box in the first outer box and fixing the first shield with the second shield. In more detail with reference made to FIG. 5, the second outer box 402 can be slidably moved relative to the first outer box 401 along the first direction X, and through fixing the second fixing holes 402a with one of the first fixing holes 401a by fasteners, the first shield and the second shield is fixed together and the length L1 of the first casing module 100 can be defined. Then, at step S113: providing an inner box. In more detail with reference made to FIG. 1 and FIG. 2, an inner wall 103a of the inner box 103 may encompass to form an accommodating channel P for accommodating the server 20. Then, at step S114: providing a rail and disposing the rail inside the inner wall of the inner box. As a result, the server 20 can be slidably moved on the rail 104 along the accommodating channel P. Then, at step S115: disposing the first shield and the second shield on an outer wall of the inner box. Thereafter, the assembling of the first casing module at step S11 in FIG. 6 can be accomplished.

Then, with reference made to FIG. 6, after finishing the step S11, the step S12 can be proceeded. At step S12: assembling a back plate module into the first outer box. As shown in FIG. 1, FIG. 3 and FIG. 4, the back plate module 200 is displaceable according to different servers 20. Then, at step S13: assembling a second casing module into the first outer box. The second casing module may include a plurality of power supply units. These power supply units 301 may offer the power to the server 20 via the back plate module 200. At last, after finishing the assembling of the modular chassis 10, a user can put the servers into the modular chassis 10 along the accommodating channel P.

As discussed above, the modular chassis and the assembling method thereof of one or more embodiments have disclosed that the modular chassis can be divided into several modularized parts, such as the first casing module, the second casing module, the back plate module and the rails. The length of the first casing module can be adjusted, so as to accommodate servers with different dimensions. Further, theses modularized parts can be replaced according to various types of servers. Therefore, there is no need to purchase chassis with different sizes to accommodate different types of servers, which enhances the usability of modular chassis of present invention and reduces the cost of purchasing different chassis for users.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A modular chassis for accommodating a server, the modular chassis comprising:
   a first casing module, comprising:
      a first outer box, comprising a first shield with a plurality of first fixing holes arranged along a direction;
      a second outer box fit in the first outer box, and being capable of sliding along the direction relative to the first outer box, the second outer box comprising a second shield with a second fixing hole, wherein the second fixing hole is fixed with one of the first fixing holes;
   a second casing module disposed inside the first casing module and comprising a plurality of power supply units; and
   a back plate module disposed inside the first casing module and comprising a first surface and a second surface opposite to each other, wherein the first surface comprises a plurality of slots, and the second surface is faced to the second casing module and is electrically connected to the plurality of the power supply units;
   wherein the server is disposed inside the first casing module and is inserted into one of the slots.

2. The modular chassis of claim 1, wherein the first casing module further comprises an inner box disposed inside the first and second outer boxes, and the first and second shields fixed with each other are fixed on an outer wall of the inner box.

3. The modular chassis of claim 2, wherein an inner wall of the inner box encompasses to form an accommodating channel, and the server is disposed inside the accommodating channel.

4. The modular chassis of claim 3, wherein an opening of the accommodating channel is rectangular.

5. The modular chassis of claim 3, wherein the first casing module further comprises a rail disposed on the inner wall of the inner box, and the server is slidably disposed on the rail along the accommodating channel.

6. The modular chassis of claim 2, wherein along the direction, a length of the inner box is smaller than a total length of the first shield and the second shield which are fixed with each other.

7. An assembling method of a modular chassis, comprising:
    assembling a first casing module, the assembling of the first casing module comprising:
        providing a first outer box comprising a first shield with a plurality of first fixing holes arranged along the direction; and
        providing a second outer box comprising a second shield with a second fixing hole, and the second outer box being configured to be fit in the first outer box, wherein the second fixing hole is fixed with one of the first fixing holes, and the second outer box is capable of sliding along a direction relative to the first outer box;
    assembling a back plate into the first outer box, wherein the back plate comprises a first surface and a second surface opposite to each other, the first surface comprises a plurality of slots, and each of the slots is configured to be connected to a server; and
    assembling a second casing module into the first outer box, wherein the second casing module comprises a plurality of power supply units configured to be electrically connected to the first surface of the back plate.

8. The assembling method of claim 7, wherein the assembling of the first casing module further comprises:
    providing an inner box and fixing the first shield and the second shield which are fixed with each other on an outer wall of the inner box.

9. The assembling method of claim 8, wherein an inner wall of the inner box encompasses to form an accommodating channel, and the assembling of the first casing module further comprises:
    providing a rail and disposing the rail inside the inner wall of the inner box, wherein the server is slidably disposed on the rail along the accommodating channel.

* * * * *